(12) United States Patent
Bhattacharya et al.

(10) Patent No.: US 7,068,074 B2
(45) Date of Patent: Jun. 27, 2006

(54) VOLTAGE LEVEL TRANSLATOR CIRCUIT

(75) Inventors: Dipankar Bhattacharya, Macungie, PA (US); Makeshwar Kothandaraman, Whitehall, PA (US); John C. Kriz, Palmerton, PA (US); Antonio M. Marques, Summit, NJ (US); Bernard L. Morris, Emmaus, PA (US)

(73) Assignee: Agere Systems Inc., Allentown, PA (US)

( * ) Notice: Subject to any disclaimer, the term of this patent is extended or adjusted under 35 U.S.C. 154(b) by 45 days.

(21) Appl. No.: 10/881,192

(22) Filed: Jun. 30, 2004

(65) Prior Publication Data

US 2006/0001449 A1 Jan. 5, 2006

(51) Int. Cl.
*H03K 19/0175* (2006.01)
*H03K 19/094* (2006.01)

(52) U.S. Cl. .............................. 326/63; 326/68; 326/81; 326/83; 326/84; 326/85; 326/86; 326/87

(58) Field of Classification Search .................. 326/63, 326/68, 81, 83–87
See application file for complete search history.

(56) References Cited

U.S. PATENT DOCUMENTS

| 5,422,523 | A | | 6/1995 | Roberts et al. | |
| 6,064,229 | A | * | 5/2000 | Morris | 326/81 |
| 6,424,173 | B1 | | 7/2002 | Vannorsdel | |
| 6,791,391 | B1 | * | 1/2003 | Nishimura et al. | 327/333 |
| 6,545,917 | B1 | * | 4/2003 | Kim | 365/189.08 |
| 6,556,061 | B1 | * | 4/2003 | Chen et al. | 327/333 |
| 6,774,698 | B1 | * | 8/2004 | Bhattacharya et al. | 327/333 |
| 6,924,689 | B1 | * | 8/2005 | Randazzo et al. | 327/333 |

* cited by examiner

*Primary Examiner*—Rexford Barnie
*Assistant Examiner*—Jason Crawford

(57) ABSTRACT

A voltage level translator circuit for translating an input signal referenced to a first voltage level to an output signal referenced to a second voltage level includes an input stage for receiving the input signal. The input stage includes at least one transistor device having a first threshold voltage associated therewith. The voltage level translator circuit further includes a latch circuit operative to store a signal representative of a logical state of the input signal. The latch circuit includes at least one transistor device having a second threshold voltage associated therewith, the second threshold voltage being greater than the first threshold voltage. A voltage clamp is operatively connected between the input stage and the latch circuit, the voltage clamp being configured to limit a voltage across the input stage based, at least in part, on a control signal presented thereto. The voltage level translator circuit includes a reference generator circuit for generating the control signal, a steady state value of the control signal being substantially equal to the first voltage level. The reference generator circuit is configured to adjust a voltage level of the control signal in response to the input signal.

20 Claims, 5 Drawing Sheets

VOLTAGE LEVEL TRANSLATOR CIRCUIT

FIELD OF THE INVENTION

The present invention relates generally to electronic circuits, and more particularly relates to voltage level translator circuits.

BACKGROUND OF THE INVENTION

Certain portable applications, including wireless handsets, notebook computers and personal digital assistants (PDAs), often employ circuitry which runs on two or more different voltage levels. For example, circuitry utilized with such portable applications may be configured so that a portion of the circuitry, such as, for example, input/output (IO) buffers, runs at a higher voltage level (e.g., about 3.3 volts), while another portion of the circuitry, such as, for example, core logic, runs at a substantially lower voltage level (e.g., about 1.0 volt). This difference in voltage levels often necessitates the use of a voltage level translator circuit for interfacing between the multiple voltage levels.

Conventional voltage level translator circuits have generally been found to be unreliable and/or at least partially inoperable at certain process, voltage and/or temperature (PVT) conditions, and/or to consume substantial direct current (DC) power. In certain portable applications, it is not uncommon to employ an appreciable number (e.g., hundreds) of voltage level translator circuits, and therefore the overall DC power consumption attributable to these voltage level translator circuits can be excessive. Moreover, for portable applications, power is typically supplied by a battery having a limited operating life. Consequently, in order to extend the operating life of the battery, it would be advantageous to eliminate or substantially reduce the amount of DC power consumed by the voltage level translator circuit(s).

There exists a need, therefore, for an improved voltage level translator circuit for interfacing between multiple voltage levels that does not suffer from one or more of the problems exhibited by conventional voltage level translator circuits.

SUMMARY OF THE INVENTION

The present invention meets the above-noted need by providing techniques for interfacing between multiple voltage levels in a circuit, such as, for example, between an input signal, which is referenced to a lower core supply voltage of the circuit, and an output signal, which is referenced to a higher supply voltage of the circuit, without any significant DC power consumption.

In accordance with one aspect of the invention, a voltage level translator circuit for translating an input signal referenced to a first voltage level to an output signal referenced to a second voltage level includes an input stage for receiving the input signal. The input stage includes at least one transistor device having a first threshold voltage associated therewith. The voltage level translator circuit further includes a latch circuit operative to store a signal representative of a logical state of the input signal. The latch circuit includes at least one transistor device having a second threshold voltage associated therewith, the second threshold voltage being greater than the first threshold voltage. A voltage clamp is operatively connected between the input stage and the latch circuit, the voltage clamp being configured to limit a voltage across the input stage based, at least in part, on a control signal presented thereto. The voltage level translator circuit includes a reference generator circuit for generating the control signal, a steady state value of the control signal being substantially equal to the first voltage level. The reference generator circuit is configured to adjust a voltage level of the control signal in response to the input signal.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of illustrative voltage level translator circuits. It should be understood, however, that the present invention is not limited to these or any other particular circuit arrangements. Rather, the invention is more generally applicable to improved techniques for interfacing between multiple voltage levels in a circuit without consuming any significant DC power. Furthermore, although implementations of the present invention are described herein with specific reference to p-type metal-oxide-semiconductor (PMOS) and n-type metal-oxide-semiconductor (NMOS) transistor devices, as may be formed using a complementary metal-oxide-semiconductor (CMOS) fabrication process, it is to be appreciated that the invention is not limited to such transistor devices and/or such a fabrication process, and that other suitable devices, such as, for example, bipolar junction transistors (BJTs), etc., and/or fabrication processes (e.g., Bipolar, BiCMOS, etc.), may be similarly employed, as will be understood by those skilled in the art.

Figure 1:
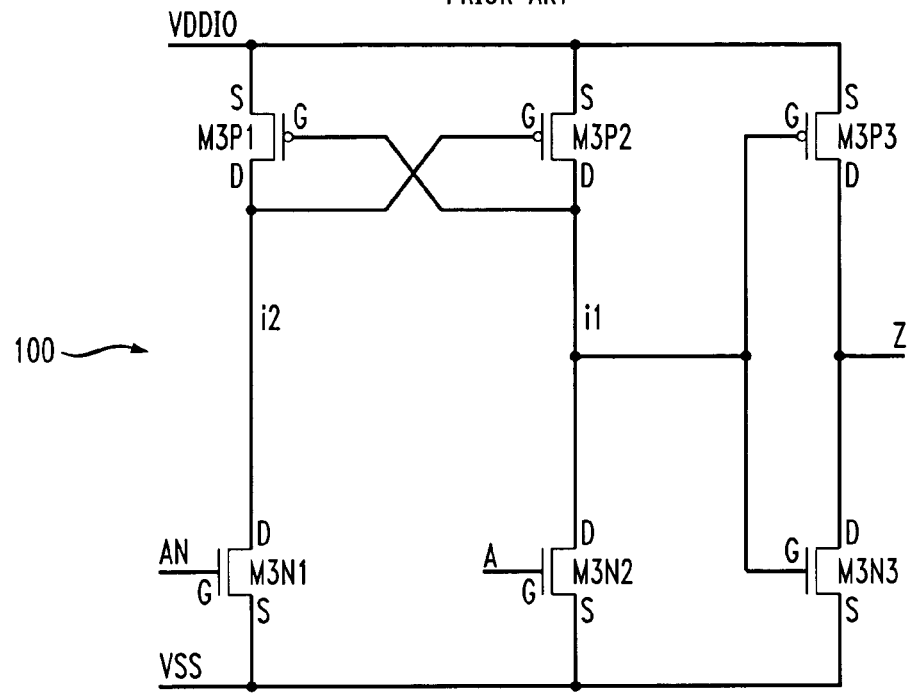
FIG. 1 is a schematic diagram illustrating a conventional voltage level translator circuit.

FIG. 1 depicts a standard voltage level translator circuit 100 that can be used to translate an input signal A, referenced to a lower core supply voltage VDDCORE, to an output signal Z which is referenced to a higher supply voltage VDDIO. In many applications, the lower core supply voltage VDDCORE is typically about 1.0 volt and the higher supply voltage VDDIO is typically about 3.3 volts. It is to be appreciated, however, that the present invention is not limited to these or to any other particular voltage levels for VDDCORE and VDDIO. Furthermore, the techniques of the present invention may be similarly employed to translate an input signal referenced to the higher supply voltage VDDIO to an output signal referenced to the lower core supply voltage VDDCORE, as will be understood by those skilled in the art.

Input signal AN is a logical inversion of input signal A, such that when signal A is a logic high level, signal AN is a logic low level, and vice versa. The voltage level translator circuit 100 is powered by the higher supply voltage VDDIO and receives, as its negative voltage supply, VSS. The term "negative voltage supply" as used herein is intended to refer to a value of the voltage supply relative to the higher supply voltage VDDIO, and does not necessarily refer to a voltage less than zero volts, although using a voltage less than zero volts is contemplated by the invention.

Traditional mixed signal integrated circuit processes typically offer "high voltage" and "low voltage" transistor devices. The high voltage devices generally have a nominal threshold voltage of about 0.75 volts and are intended to operate with the higher supply voltage VDDIO (e.g., about 3.3 volts). The low voltage devices have a nominal threshold voltage which is substantially lower than the high voltage devices, such as, for example, about 0.35 volts, and are intended to operate with the lower core supply voltage VDDCORE (e.g., about 1.0 volt). In the voltage level translator circuit 100, all of the transistor devices, namely, M3P1, M3P2, M3P3, M3N1, M3N2 and M3N3, are high voltage devices.

The voltage level translator circuit 100 comprises a pair of PMOS transistors M3P1 and M3P2 each having a source terminal (S) connected to the positive voltage supply VDDIO, and having a gate terminal (G) of one transistor connected to a drain terminal (D) of the other transistor in a cross-coupled arrangement. Specifically, the gate terminal of M3P1 is connected to the drain terminal of M3P2 at node i1, and the gate terminal of M3P2 is connected to the drain terminal of M3P1 at node i2. It is to be appreciated that, because the MOS device is symmetrical in nature, and thus bidirectional, the assignment of source and drain designations in the MOS device is essentially arbitrary. Therefore, the source and drain regions may be referred to generally as first and second source/drain regions, respectively, where "source/drain" in this context denotes a source region or a drain region.

The voltage level translator circuit 100 further comprises NMOS transistor M3N1 having a source terminal connected to the negative voltage supply VSS, a drain terminal connected to node i2, and a gate terminal for receiving input signal AN. Voltage level translator circuit 100 also includes NMOS transistor M3N2 having a source terminal connected to the negative voltage supply VSS, a drain terminal connected to node i1, and a gate terminal for receiving input signal A. An output stage comprising PMOS transistor M3P3 and NMOS transistor M3N3 connected togther as a standard inverter, is connected to node i1 and generates an output signal Z of the voltage level translator circuit 100.

Under most operating conditions of the voltage level translator circuit 100, signal A being a logic high ("1") turns on transistor M3N2, pulling node i1 low. Signal AN being an inversion of signal A will thus be a logic low ("0"), thereby turning off transistor M3N1. Node i1 being at a low voltage turns on transistor M3P1, pulling node i2 high and turning off transistor M3P2. The output signal Z being an inversion of node i1 will be a logic high when node i1 is low. A primary disadvantage of the voltage level translator circuit 100, however, is that, under certain PVT conditions, such as, for example, when the temperature is low (e.g., about zero degrees Celsius), the threshold voltage of transistors M3N1 and M3N2 may be high, such as about 0.8 volt or higher, which is only about one tenth of a volt or less below a minimum voltage limit of the lower core supply VDDCORE (e.g., about 0.9 volt) to which input signal A is referenced. Due to voltage drops internal to the circuit, the actual voltage seen by devices M3N1 and M3N2 could be even lower. With less than about one tenth of a volt of overdrive, transistors M3N1 and M3N2 will be unacceptably slow and may even fail to turn on entirely, thus rendering the voltage level translator circuit 100 unreliable and/or inoperable.

Figure 2:
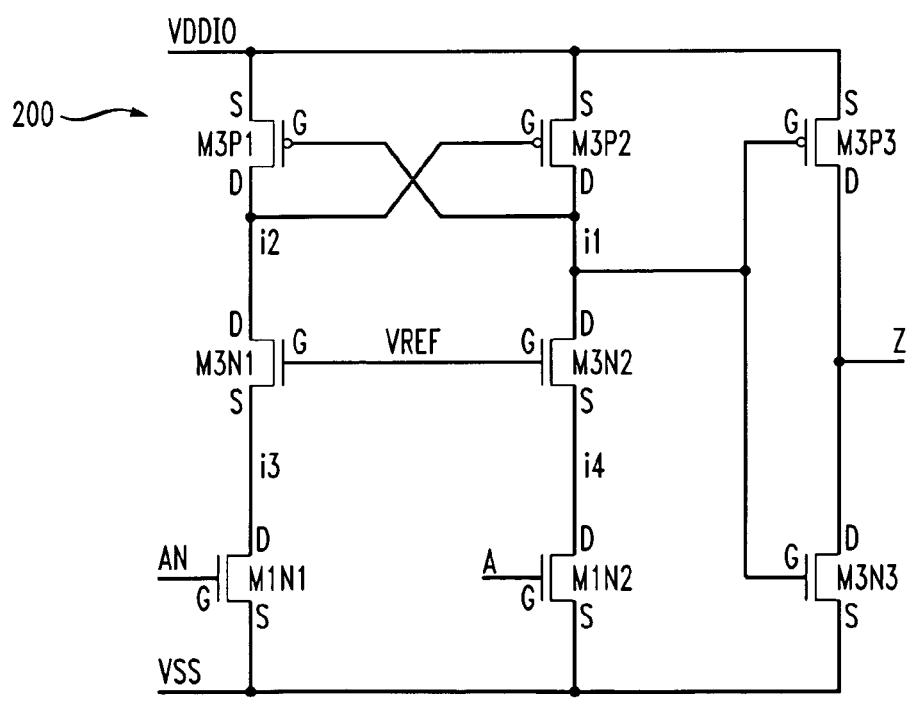
FIG. 2 is a schematic diagram depicting a voltage level translator circuit in which the methodologies of the present invention may be implemented.

One way to overcome this problem is to employ low voltage NMOS transistors M1N1 and M1N2 in place of the high voltage transistors M3N1 and M3N2, respectively, as shown in the voltage level translator circuit 200 of FIG. 2. As previously stated, low voltage transistors typically have a nominal threshold voltage (e.g., about 0.35 volt) which is substantially lower than the nominal threshold voltage of high voltage transistors, thus providing more overdrive compared to the high voltage devices. The additional few tenths of a volt of overdrive obtained by using low voltage devices is generally sufficient to ensure that the voltage level translator circuit 200 remains operable over the desired range of PVT variations. However, the voltage appearing across any two terminals of transistors M1N1 and M1N2 should be limited, for example, to less than an upper limit of the lower core supply VDDCORE, typically about 1.26 volts, so as to avoid damaging the devices. Since nodes i1 and i2 can be pulled up to the higher supply voltage VDDIO, which is nominally about 3.3 volts, transistors M3N1 and M3N2 are preferably added between the low voltage transistors M1N1 and M1N2 and the cross-coupled high voltage PMOS transistors M3P1 and M3P2, respectively. Specifically, source terminals of transistors M1N1 and M1N2 are connected to VSS, a drain terminal of M1N1 is connected to a source terminal of transistor M3N1 at node i3, and a drain terminal of M1N2 is connected to a source terminal of transistor M3N2 at node i4. A drain terminal of M3N1 is connected to the drain terminal of transistor M3P1 at node i2, and a drain terminal of M3N2 is connected to the drain terminal of transistor M3P2 at node i1. The cross-coupled devices M3P1 and M3P2 may be connected in a manner similar to that shown in FIG. 1.

In order to bias transistors M3N1 and M3N2 to a desired operating point so as to limit the voltage across devices M1N1 and M1N2, respectively, gate terminals of M3N1 and M3N2 may be connected to a common reference voltage VREF. For most PVT conditions and for low speed applications (e.g., less than about 200 megahertz (MHz)), it would be sufficient to use the lower core supply VDDCORE as the reference voltage VREF. Since these devices do not switch on and off, one tenth of a volt of overdrive is generally acceptable to keep the devices turned on. However, in order to satisfy all desired PVT conditions, devices M3N1 and M3N2 may be required to be sized significantly large, and the voltage level translator circuit 200 may fail to operate reliably even for a moderate speed of about 200 MHz.

Figure 3:
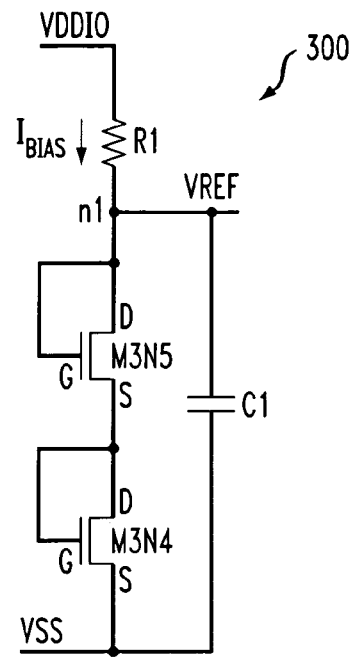
FIG. 3 is a schematic diagram illustrating a voltage reference circuit suitable for use in the voltage level translator circuit shown in FIG. 2.

A solution is to employ a bias generator circuit 300, as illustrated in FIG. 3, for generating the reference voltage VREF, which is preferably slightly higher than VDDCORE to provide ample overdrive for devices M3N1 and M3N2. As apparent from the figure, bias generator circuit 300 may include a pair of high voltage diode-connected NMOS transistor devices M3N4 and M3N5. The two devices M3N4 and M3N5 are connected in series between VSS and VDDIO via a resistor R1. Reference voltage VREF may be set to a desired level by selecting an appropriate resistance value for resistor R1 and/or appropriately sizing devices M3N4 and M3N5, as will be understood by those skilled in the art. The reference voltage VREF generated by the bias generator circuit 300 essentially clamps nodes i3 and i4 to a high threshold voltage (e.g., about 0.75 volt) above VSS. The resistance value of resistor R1 is chosen to be high enough (e.g., greater than about 100 kilo (K) ohms) such that the current $I_{BIAS}$ consumed by the bias generator circuit 300 is relatively small (e.g., micoramperes).

A filter capacitor C1 is connected between an output node n1 of the bias generator circuit 300 and the negative voltage supply VSS to help filter out any high frequency components that may be present in the reference voltage VREF generated by the bias generator circuit 300. Capacitor C1 is preferably chosen to be about 0.5 picofarad (pF). The current $I_{BIAS}$ in the bias generator circuit 300 and the capacitor C1 are scaled up with the required speed of operation of the voltage level translator circuit 200 in which the bias generator circuit 300 may be employed.

Unfortunately, in addition to consuming considerable area in the integrated circuit, due at least in part to the high-valued resistor R1 and capacitor C1, the bias generator circuit 300 consumes DC current, which is undesirable, particularly for portable applications in which an extended battery life is important. In certain applications, one bias generator is required for each input/output buffer, and there may be hundreds of buffers employed in a given integrated circuit device. Therefore, the overall DC current consumption attributable to the bias generator circuits can become quite significant.

Figure 4:
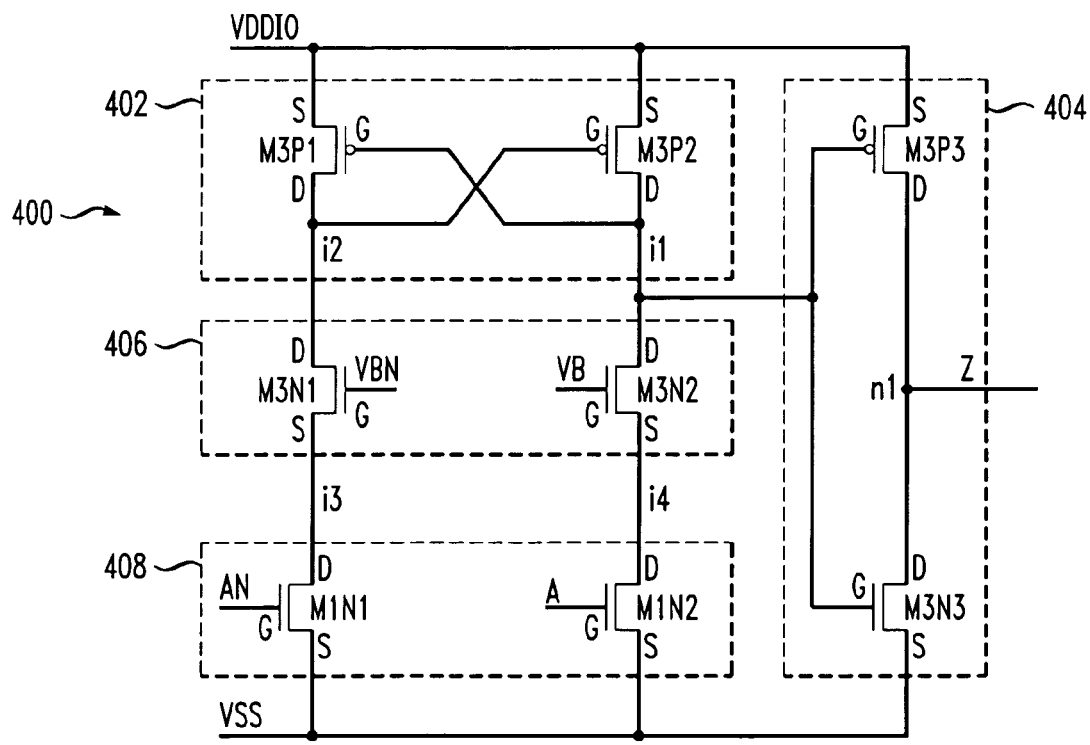
FIG. 4 is a schematic diagram illustrating an exemplary voltage level translator circuit, formed in accordance with one embodiment of the present invention.

FIG. 4 is a schematic diagram illustrating an exemplary voltage level translator circuit 400, formed in accordance with the present invention. The illustrative voltage level translator circuit 400 provides a simple and robust solution that is capable of elegantly interfacing between multiple voltage levels in a circuit without any significant DC power consumption. Voltage level translator circuit 400 preferably includes an input stage 408 configured for receiving at least one input signal (e.g., signal A) which is referenced to a lower core supply voltage VDDCORE (e.g., about 1.0 volt), and a latch circuit 402 for at least temporarily storing an output signal which is referenced to a higher supply voltage VDDIO (e.g., about 3.3 volts) and is representative of a logical state of the input signal. A voltage clamp 406 is operatively coupled between the input stage 408 and the latch circuit 402. The voltage level translator circuit 400 may also include an output stage 404 coupled to the latch circuit 402 for buffering the output signal stored in the latch circuit and for generating a buffered output signal (e.g., signal Z) of the voltage level translator circuit having substantially rail-to-rail (e.g., VSS to VDDIO) logic levels.

Like the voltage level translator circuit 200 depicted in FIG. 2, the input stage 408 of voltage level translator circuit 300 preferably comprises a pair of low voltage NMOS devices M1N1 and M1N2. The low voltage devices, having a lower threshold voltage (e.g., about 0.35 volt) compared to a high voltage device, provide the input stage with additional overdrive so as to ensure proper operation of the voltage level translator circuit 400 over a desired range of PVT variations. Each of devices M1N1 and M1N2 includes a source, a drain and a gate terminal. The source terminals of M1N1 and M1N2 are connected to a negative voltage supply, which may be VSS. The gate terminal of M1N1 preferably receives input signal AN, which, as stated above, is referenced to the lower core supply voltage VDDCORE. The gate terminal of M1N2 receives input signal A, which is a logical inversion of input signal AN and is similarly referenced to the lower core supply voltage VDDCORE. The drain terminals of M1N1 and M1N2 are connected to the voltage clamp 406 at nodes i3 and i4, respectively.

Since devices M1N1 and M1N2 are low voltage devices, voltage clamp 406 preferably serves as a primary means for preventing the voltage at nodes i3 and i4 from exceeding a voltage substantially equal to a maximum upper limit of the lower core supply voltage VDDCORE, which is about 1.26 volts for this exemplary embodiment. In this manner, device M1N1 and M1N2 are protected from voltage overstress, which can lead to device failure. Voltage clamp 406 preferably comprises a pair of high voltage NMOS transistor devices M3N1 and M3N2. As previously explained, high voltage devices typically have threshold voltages that are substantially higher compared to low voltage devices (e.g., about 0.75 volt) for a given integrated circuit process.

The voltage clamp 406 is preferably configured such that a source terminal of M3N1 is connected to the drain terminal of M1N1 at node i3, a source terminal of M3N2 is connected to the drain terminal of M1N2 at node i4, and drain terminals of M3N1 and M3N2 are connected to the latch circuit 402 at nodes i2 and i1, respectively. Gate terminals of M3N1 and M3N2 are connected to bias voltage signals VBN and VB, respectively, for selectively controlling the voltages at corresponding nodes i3 and i4. Unlike devices M3N1 and M3N2 in the voltage level translator circuit 200 depicted in FIG. 2, the devices M3N1 and M3N2 in voltage clamp 406 are not biased by a common reference voltage (VREF) that is generated by a bias generator circuit which consumes DC power. Instead, each of devices M3N1 and M3N2 in voltage clamp 406 receives a separate bias voltage VBN and VB, respectively. Furthermore, signals VBN and VB are generated without consuming any significant DC power, as will be described in further detail below.

Figure 5:
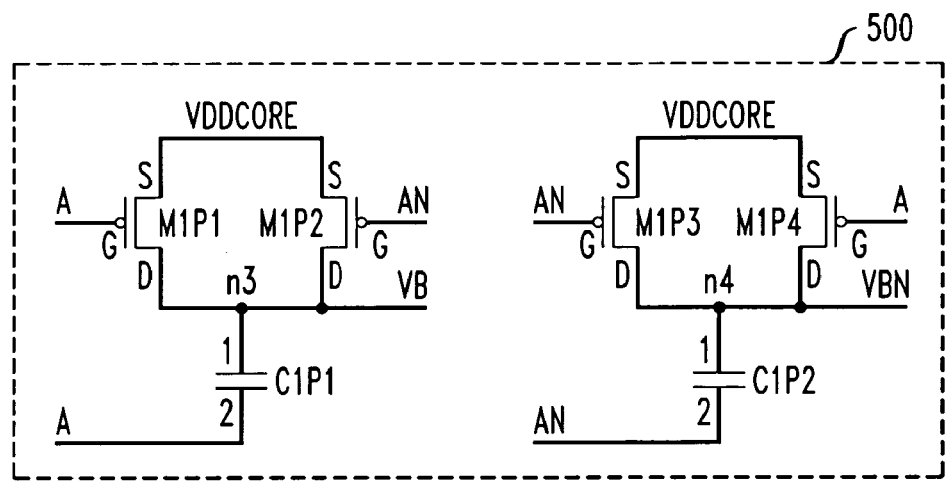
FIG. 5 is a schematic diagram illustrating an exemplary voltage reference circuit which may be used in the voltage level translator circuit shown in FIG. 4.

FIG. 5 illustrates an exemplary bias generator circuit 500 for generating the bias signals VB and VBN used by the voltage level translator circuit 400 of FIG. 4, in accordance with one aspect of the invention. It is to be appreciated that bias generator circuit 500 may be included in the voltage clamp 406, or, alternatively, the bias generator circuit 500 may be external to the voltage clamp 406. Moreover, it is contemplated that two or more voltage level translator circuits 400 may share a given bias generator circuit 500. The bias generator circuit 500 is configured to provide sufficient overdrive for devices M3N1 and M3N2 over a desired range of PVT variations, without consuming any significant DC power.

Bias generator circuit 500 is operative to dynamically control the respective overdrives to devices M3N1 and M3N2 as signals A and AN switch from one logic level to another. To accomplish this, signal VB, which is generated at node n3, is connected to the lower core supply voltage VDDCORE by one of a pair of low voltage PMOS transistor devices, M1P1 and M1P2. For instance, when input signal A is a logic low, signal VB will be connected to VDDCORE via device M1P1, and when signal A is a logic high, signal VB will be connected to VDDCORE via device M1P2. Source terminals of devices M1P1 and M1P2 are connected to VDDCORE and drain terminals of M1P1 and M1P2 are connected to node n3. A gate terminal of M1P1 preferably receives signal A and a gate terminal of M1P2 receives signal AN. A capacitor C1P1 is preferably connected to node n3 at a first end (e.g., terminal 1), and receives signal A at a second end (e.g., terminal 2). The value of capacitor C1P1 is preferably chosen to be about 0.35 pF for high-frequency operation (e.g., above about 500 MHz), or about 0.1 pF for low-frequency operation (e.g., less than about 500 MHz), although the invention is not limited to a particular value for capacitor C1P1.

Likewise, signal VBN, which is generated at node n4, is connected to the lower core supply voltage VDDCORE by one of a pair of low voltage PMOS transistor devices, M1P3 and M1P4. Source terminals of devices M1P3 and M1P4 are connected to the lower core supply voltage VDDCORE and drain terminals of M1P3 and M1P4 are connected to node n4. A gate terminal of M1P3 preferably receives signal AN and a gate terminal of M1P4 receives signal A. A capacitor C1P2 is preferably connected to node n4 at a first end (e.g., terminal 1), and receives signal AN at a second end (e.g., terminal 2). The value of capacitor C1P2, like capacitor C1P1, is preferably chosen to be about 0.35 pF for high-frequency operation, or about 0.1 pF for low-frequency operation, although the invention is not limited to a particular value for capacitor C1P2.

It is to be appreictaed that while the bias generator circuit 500 is shown as comprising low voltage PMOS devices, namely, M1P1, M1P2, M1P3 and M1P4, gated by input signals A or AN, the bias generator circuit is not limited to PMOS devices, but may alternatively include other resistive load devices, such as, for example, an NMOS device, resistor, etc. For example, PMOS devices M1P1 and M1P2 may be replaced by a resistor (not shown) connected between node n3 and VDDCORE. Moreover, the PMOS devices need not be gated by input signals A and AN, but may instead be grounded gate PMOS devices, as will be understood by those skilled in the art.

A steady state value of signals VB and VBN will be substantially equal to the lower core supply voltage VDDCORE, since nodes n3 and n4 will be pulled up to VDDCORE either via devices M1P1 or M1P2, for signal VB, or via devices M1P3 and M1P4, for signal VBN. Capacitors C1P1 and C1P2 provide signals VB and VBN, respectively, with a momentary boost in either the positive or negative direction relative to the steady state value of VB and VBN. The voltage across capacitors C1P1 and C1P2 are either added to or subtracted from the steady state value of signals VB and VBN as a function of the direction of transition of signals A and AN, respectively. For example, assuming node n3 is at the lower core supply voltage VDDCORE during steady state, when signal A transitions from a logic low to a logic high, signal VB will receive a boost in the positive direction. When signal A transitions from a logic high to a logic low, signal VB will receive a boost in the negative direction (e.g., less than the steady state value). A negative boost in signal VB is advantageous for more quickly turning off device M3N2, thereby speeding the switching of latch circuit 402 in the voltage level translator circuit 400. Signal VBN is generated in a similar manner.

Since signal A is referenced with respect to VDDCORE, the voltage across capacitor C1P1 will also be substantially equal to VDDCORE when signal A is low. When signal A transitions from a logic low to a logic high, signal VB will momentarily rise to about a few hundred millivolts higher than transporting data through VDDCORE, before returning to its steady state value of VDDCORE. When signal A is a logic high, the voltage across capacitor C1P1 will be about zero, since node n3 will also be at about VDDCORE. Therefore, when signal A transitions from a logic high to a logic low, signal VB will be pulled low momentarily as capacitor C1P1 charges to VDDCORE. Signal VBN is generated in a similar manner, only based on signal AN rather than signal A. The duration of the dynamic boost in signals VB and VBN will be primarily a function of the charging and discharging times of the capacitors C1P1 and C1P2, respectively. These charging and discharging times may be selectively controlled, at least in part, by sizing the devices, namely, devices M1P1, M1P2, M1P3 and M1P4, as desired.

Each of capacitors C1P1 and C1P2 may be implemented as a PMOS device, either in an accumulation mode or in a depletion mode, although alternative structures for implementing capacitors C1P1 and C1P2 are similarly contemplated. A bulk terminal of each capacitor can be connected to VDDCORE to reduce integrated circuit layout area. At least a portion of the structures for generating signal VB (e.g., M1P1, M1P2 and C1P1) or signal VBN (e.g., M1P3, M1P4 and C1P2) may be shielded by metal, with the metal shield connected to VDDCORE.

With continued reference to FIG. 4, latch circuit 402 preferably comprises a pair of high voltage PMOS transistor devices M3P1 and M3P2 connected in a cross-coupled arrangement, in a manner similar to the voltage level translator circuit 200 of FIG. 2. Specifically, a gate terminal of M3P1 is connected to a drain terminal of M3P2 at node i1, and a gate terminal of M3P2 is connected to a drain terminal of M3P1 at node i2. Source terminals of M3P1 and M3P2 are connected to a positive voltage supply, which may be VDDIO. Latch circuit 402 is configured to at least temporarily store the voltages at nodes i1 and i2, which are representative of the input signals A and AN, without consuming any significant DC power. The present invention contemplates that alternative circuitry may be employed for storing the output of the voltage translator circuit 400, as will be understood by those skilled in the art.

The output stage 404, which may be used to generate output signal Z, preferably comprises a high voltage NMOS transistor device M3N3 and a high voltage PMOS transistor device M3P3 connected in an inverter arrangement. Specifically, gate terminals of M3N3 and M3P3 are connected together to form an input of output stage 404, drain terminals of M3N3 and M3P3 are connected together to form an output of the output stage at node n 1, and source terminals of M3N3 and M3P3 are connected to voltage supplies VSS and VDDIO, respectively. The input of output stage 404 is connected to an output of the latch circuit 402 at node i1. The output stage 404 serves primarily to generate the output signal Z having substantially rail-to-rail logic levels and to buffer the output of the latch circuit 402 at node i1. Since the output stage 404 in the exemplary voltage level translator circuit 400 is inverting, its input is taken from node i1 in order to keep the logic level of the output signal Z the same as the input signal A. It is to be appreciated that, in an alternative embodiment of the invention, when a noninverting output stage is employed, the input of the output stage would preferably be connected to node i2 so that the logic level of output signal Z is the same as the logic level of the input signal A.

By way of example only, the operation of voltage level translator circuit 400 will be described. When signal A is a logic low and signal AN, being a logical inversion of signal A, is a logic high, device M1N1 is turned on and device M1N2 is turned off. Device M1N1 being turned on pulls node i2 low, provided device M3N1 is fully turned on, which turns on device M3P2. With M3P2 turned on, node i1 will be pulled high, thereby turning off device M3P1. With M1N2 turned off, node i4 will also be high, provided device M3N2 is fully turned on. When signal A switches from logic low to logic high, M1N2 turns on and pulls node i4 low. At the same time, signal A switching from logic low to logic high dynamically causes signal VB to rise above its steady state voltage VDDCORE, thereby providing a substantial overdrive for device M3N2 and causing node i1 to be pulled low more quickly compared to if signal VB were not boosted higher than VDDCORE. Concurrently, signal AN switching from logic high to logic low dynamically causes signal VBN to drop below its steady states voltage VDDCORE, thereby turning off device M3N1 more quickly and providing more effective isolation between nodes i2 and i3. This allows node i2 to transition to a logic high faster, turning off M3P2.

Similarly, when signal A switches from logic high to logic low and signal AN switches from logic low to logic high, M1N1 turns on and pulls node i3 low, and M1N2 turns off. At the same time, signal AN switching from logic low to logic high dynamically causes signal VBN to rise above its steady state voltage VDDCORE, thereby providing a substantial overdrive for device M3N1 and causing node i2 to be pulled low more quickly compared to if signal VBN were not boosted higher than VDDCORE. Concurrently, signal A switching from logic high to logic low dynamically causes signal VB to drop below its steady states voltage VDDCORE, thereby turning off device M3N2 more quickly and providing more effective isolation between nodes i1 and i4. This allows node i1 to transition to a logic high faster, turning off M3P1.

Figure 6:
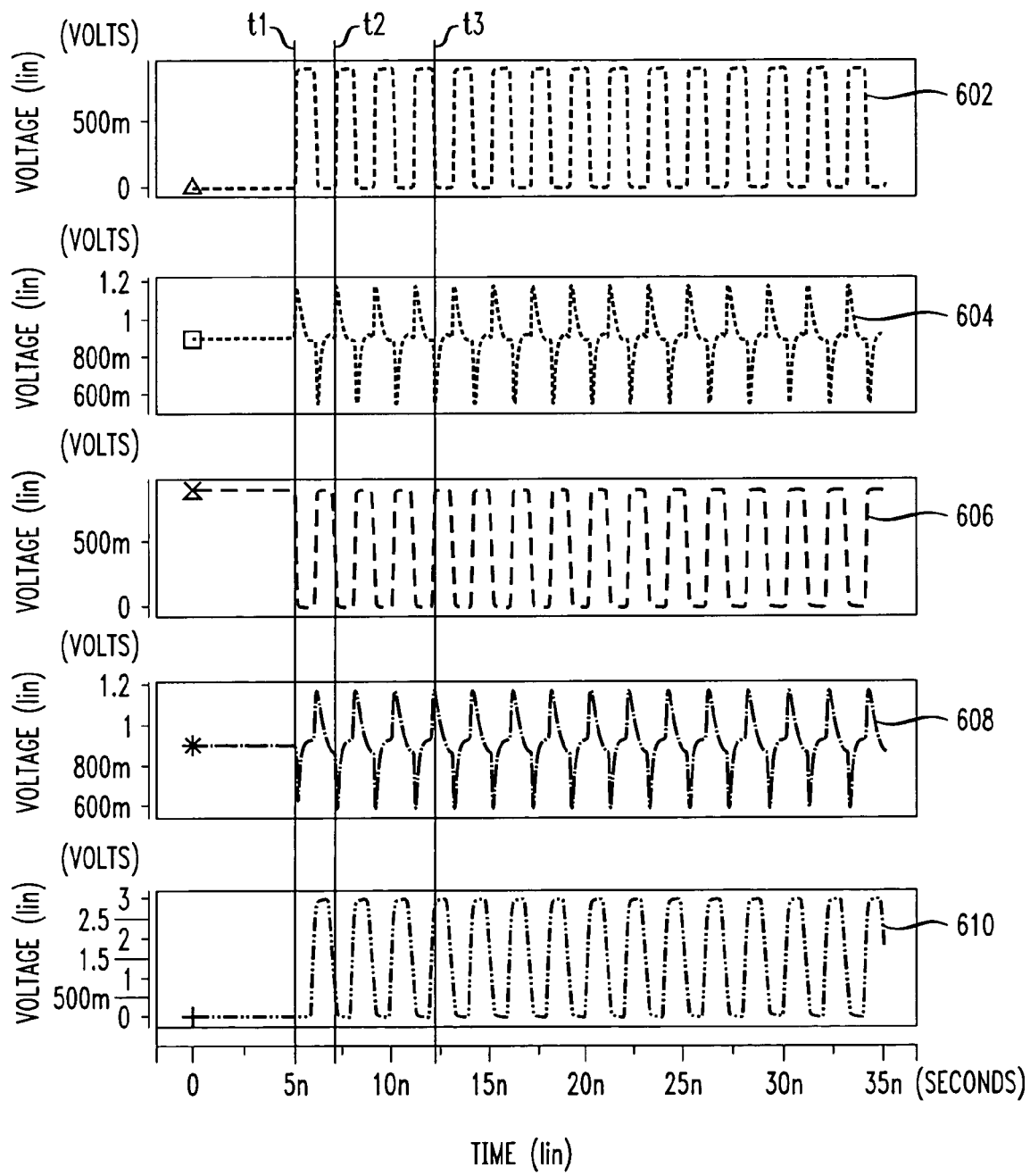
FIG. 6 is a graphical representation depicting exemplary voltage levels as a function of time for certain signals corresponding to the circuits shown in FIGS. 4 and 5, in accordance with the present invention.

FIG. 6 is a graphical representation of exemplary simulation results of certain signals in the illustrative voltage level translator circuit 400 of FIG. 4 reference circuit 500 of FIG. 5, as a function of time (in seconds). The simulation results are provided for the illustrative voltage level translator circuit operating at a speed of about 500 MHz and under worst case PVT conditions (e.g., slow integrated circuit process, low temperature). Input signal A is represented by graph 602, bias signal VB is represented by graph 604, input signal AN is represented by graph 606, bias signal VBN is represented by graph 608, and output signal Z is represented by graph 610. As apparent from the figure, bias signals VB and VBN change dynamically either up or down from their steady state voltages of about 0.9 volt at each edge transition (e.g., t1, t2, t3) of input signals A and AN.

Figure 7:
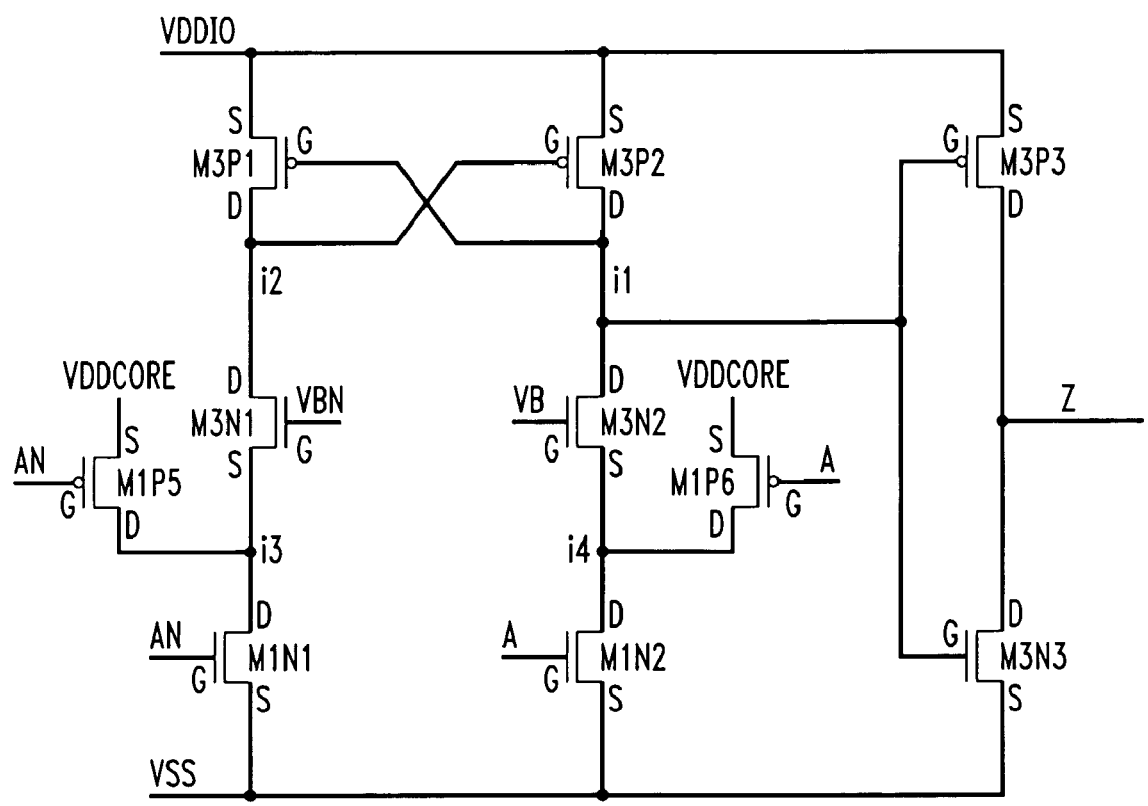
FIG. 7 is a schematic diagram illustrating an exemplary voltage level translator circuit, formed in accordance with a second embodiment of the present invention.

FIG. 7 is a schematic diagram illustrating an exemplary voltage level translator circuit 700, formed in accordance with another embodiment of the invention. The voltage level translator circuit 700 may be essentially identical to the voltage level translator circuit 400 shown in FIG. 4, except for the addition of two low voltage PMOS transistor devices M1P5 and M1P6. Source terminals of M1P5 and M1P6 are preferably connected to the low core supply voltage VDDCORE, a drain terminal of M1P5 is connected to node i3, and a drain terminal of M1P6 is connected to node i4. A gate terminal of M1P5 preferably receives input signal AN and a gate terminal of M1P6 receives input signal A.

Devices M1P5 and M1P6 function primarily to speed up the operation of voltage level translator circuit 700. For example, when signal A switches from a logic low to a logic high, and thus signal AN switches from a logic high to a logic low, device M1P5 advantageously pulls node i3 high, such as to about VDDCORE. Similarly, when signal A switches from a logic high to a logic low and signal AN switches from a logic low to a logic high, device M1P6 pulls node i4 high. In addition, since M1P5 and M1P6 are connected to VDDCORE, these devices, when active, effectively clamp the voltage at nodes i3 and i4 to a maximum of about VDDCORE, thereby further ensuring that devices M1N1 and M1N2 are never stressed beyond an acceptable limit.

Figure 8:
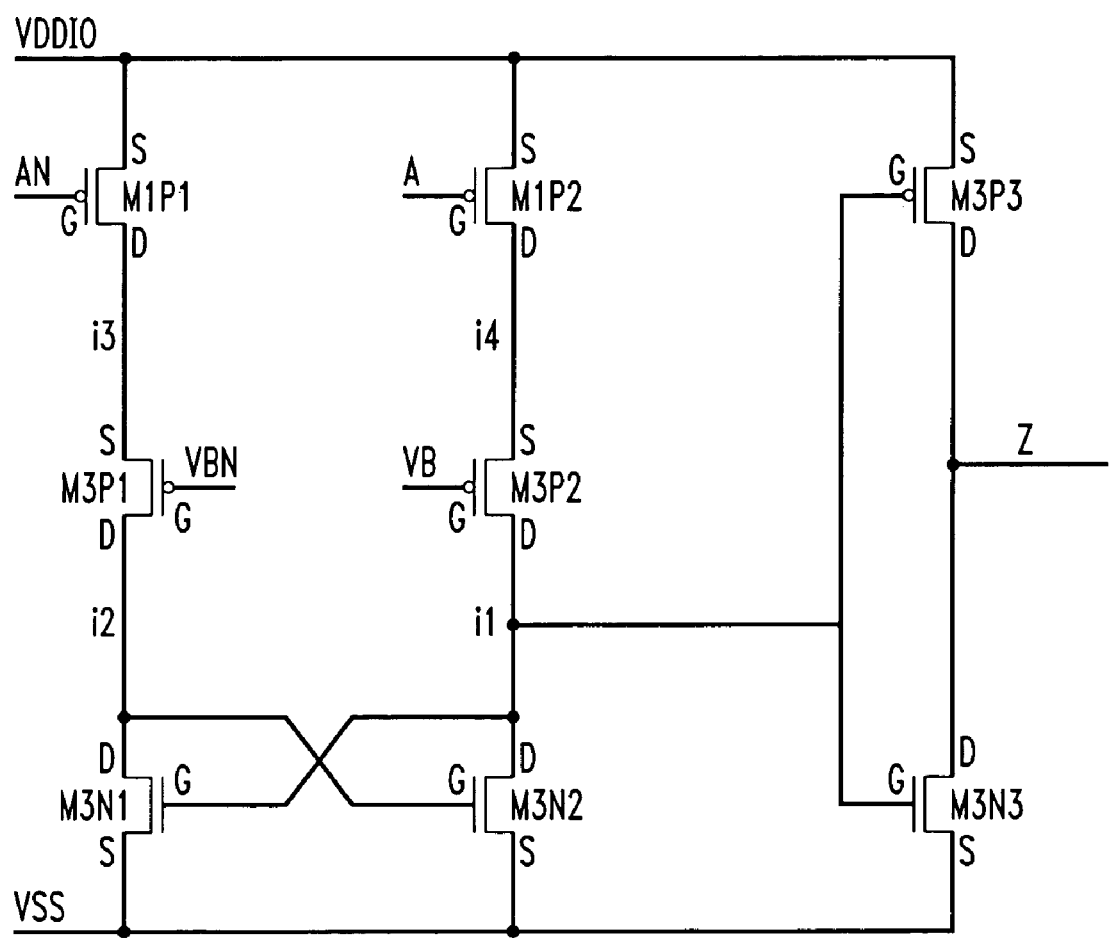
FIG. 8 is a schematic diagram illustrating an exemplary voltage level translator circuit, formed in accordance with a third embodiment of the present invention.

It is to be appreciated that the voltage level translation techniques of the present invention described herein may be used with alternative circuit configurations for translating among other voltage levels without consuming any significant DC power, as will be understood by those skilled in the art. For example, FIG. 8 illustrates an exemplary voltage level translator circuit 800, formed in accordance with an alternative embodiment of the invention. Voltage level translator circuit 800 is similar to the voltage level translator circuit 400 shown in FIG. 4, except that the circuit configurations are essentially flipped upside down from one another, and voltage level translator circuit 800 employs transistor devices having polarities opposite to the polarities of the transistor devices in voltage level translator circuit 400, as will be understood by those skilled in the art. Additionally, VDDIO and VDDCORE are preferably zero volts, VSS is preferably about −3.3 volts, and a negative lower core supply voltage VSSCORE is preferably about −1.0 volt, where VDDIO and VDDCORE are electrically isolated from one another, and VSS and VSSCORE are electrically isolated from one another.

At least a portion of the voltage level translator circuit of the present invention may be implemented in an integrated circuit. A plurality of identical die are typically formed in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A voltage level translator circuit for translating an input signal referenced to a first voltage level to an output signal referenced to a second voltage level, the circuit comprising:
    an input stage for receiving the input signal, the input stage including at least one transistor device having a first threshold voltage associated therewith;
    a latch circuit being operative to store a signal representative of a logical state of the input signal, the latch circuit including at least one transistor device having a second threshold voltage associated therewith, the second threshold voltage being greater than the first threshold voltage;
    a voltage clamp operatively connected between the input stage and the latch circuit, the voltage clamp being configured to limit a voltage across the input stage based, at least in part, on a control signal presented to the voltage clamp; and
    a reference generator circuit for generating the control signal, a steady state value of the control signal being substantially equal to the first voltage level, the reference generator circuit being configured to adjust a voltage level of the control signal in response to the input signal.

2. The circuit of claim 1, wherein the reference generator circuit is operative to adjust the voltage level of the control signal by dynamically adding a designated voltage to or subtracting the designated voltage from the control signal in response to the input signal.

3. The circuit of claim 1, wherein the first voltage level is less than the second voltage level.

4. The circuit of claim 1, wherein the designated voltage is selected to bias the voltage clamp at a desired operating point so as to ensure a desired operation of the circuit over a variation in at least one of a process, a voltage and a temperature characteristic associated with the circuit.

5. The circuit of claim 1, further comprising an output stage having an input connected to an output of the latch circuit.

6. The circuit of claim 5, wherein the output stage comprises an inverting output circuit.

7. The circuit of claim 1, wherein the input stage comprises first and second transistor devices having the first threshold voltage associated therewith, each transistor device including a source terminal, a drain terminal and a gate terminal, the source terminals being connected to the first voltage supply, the drain terminals being connected to the voltage clamp, the gate terminal of the first transistor device receiving the input signal, and the gate terminal of the second transistor device receiving a logical inversion of the input signal.

8. The circuit of claim 7, wherein the first and second transistor devices in the input stage comprise n-type metal-oxide-semiconductor transistors.

9. The circuit of claim 1, wherein the voltage clamp comprises first and second transistor devices having the second threshold voltage associated therewith, each transistor device including a source terminal, a drain terminal and a gate terminal, the source terminals being connected to the input stage, the drain terminals being connected to the latch circuit, the gate terminal of the first transistor device receiving the control signal, and the gate terminal of the second transistor device receiving a second control signal, the second control signal having a steady state value that is substantially equal to the steady state value of the control signal, the second control signal having an alternating current value that is substantially equal in magnitude and opposite in polarity to an alternating current value of the control signal.

10. The circuit of claim 9, wherein the first and second transistor devices in the voltage clamp comprise n-type metal-oxide-semiconductor transistors.

11. The circuit of claim 1, wherein the latch circuit comprises first and second transistor devices, each transistor device including a source terminal, a drain terminal and a gate terminal, the source terminals being connected to the second voltage supply and the drain terminals being connected to the voltage clamp, the gate terminal of the first transistor device being connected to the drain terminal of the second transistor device, and the gate terminal of the second transistor device being connected to the gate terminal of the first transistor device.

12. The circuit of claim 11, wherein the first and second transistor devices in the latch circuit comprise p-type metal-oxide-semiconductor transistors.

13. The circuit of claim 1, wherein the reference generator circuit comprises a capacitor and first and second transistor devices, each transistor device including a source terminal, a drain terminal and a gate terminal, the source terminals being connected to the first voltage level, a first terminal of the capacitor being connected to the drain terminals of the first and second transistor devices and a second terminal of the capacitor receiving the input signal, the gate terminal of the first transistor device receiving the input signal and the gate terminal of the second transistor device receiving a logical inversion of the input signal, the control signal being generated at the junction of the drain terminals of the first and second transistor devices and the second terminal of the capacitor.

14. The circuit of claim 1, further comprising a transistor device having a source terminal connected to the first voltage level, a drain terminal connected to a junction between the voltage clamp and the input stage, and a gate terminal for receiving the input signal.

15. The circuit of claim 1, wherein the reference circuit comprises:
   a resistive load connected between the first voltage level and an output of the reference circuit for generating the control signal; and
   a capacitor including a first terminal connected to the output of the reference circuit and including a second terminal for receiving the input signal.

16. The circuit of claim 1, wherein the reference circuit comprises:
   a first p-type metal-oxide-semiconductor (PMOS) device having the first threshold voltage associated therewith, the first PMOS device including a source terminal connected to the first voltage level, a drain terminal connected to a first output of the reference circuit for generating the control signal, and a gate terminal for receiving the input signal;
   a second PMOS device having the first threshold voltage associated therewith, the second PMOS device including a source terminal connected to the first voltage level, a drain terminal connected to the first output, and a gate terminal for receiving a logical inversion of the input signal;
   a third PMOS device having the first threshold voltage associated therewith, the third PMOS device including a source terminal connected to the first voltage level, a drain terminal connected to a second output of the reference circuit for generating a second control signal, and a gate terminal for receiving the logical inversion of the input signal;
   a fourth PMOS device having the first threshold voltage associated therewith, the fourth PMOS device including a source terminal connected to the first voltage level, a drain terminal connected to the second output, and a gate terminal for receiving the input signal;
   a first capacitor including a first terminal connected to the first output and a second terminal for receiving the input signal; and
   a second capacitor including a first terminal connected to the second output and a second terminal for receiving the logical inversion of the input signal.

17. The circuit of claim 1, wherein the first voltage level is about 1.0 volt and the second voltage level is about 3.3 volts.

18. An integrated circuit including at least one voltage level translator circuit for translating an input signal referenced to a first voltage level to an output signal referenced to a second voltage level, the at least one voltage level translator circuit comprising:
   an input stage for receiving the input signal, the input stage including at least one transistor device having a first threshold voltage associated therewith;
   a latch circuit being operative to store a signal representative of a logical state of the input signal, the latch circuit including at least one transistor device having a second threshold voltage associated therewith, the second threshold voltage being greater than the first threshold voltage;

a voltage clamp operatively connected between the input stage and the latch circuit, the voltage clamp being configured to limit a voltage across the input stage based, at least in part, on a control signal presented to the voltage clamp; and a reference generator circuit for generating the control signal, a steady state value of the control signal being substantially equal to the first voltage level, the reference generator circuit being configured to adjust a voltage level of the control signal in response to the input signal.

19. The circuit of claim 18, wherein the reference generator circuit is operative to adjust the voltage level of the control signal by dynamically adding a designated voltage to or subtracting the designated voltage from the control signal in response to the input signal.

20. The circuit of claim 18, wherein the designated voltage is selected to bias the voltage clamp at a desired operating point so as to ensure a desired operation of the circuit over a variation in at least one of a process, a voltage and a temperature characteristic associated with the circuit.

* * * * *

UNITED STATES PATENT AND TRADEMARK OFFICE
CERTIFICATE OF CORRECTION

PATENT NO. : 7,068,074 B2  Page 1 of 1
APPLICATION NO. : 10/881192
DATED : June 27, 2006
INVENTOR(S) : D. Bhattacharya et al.

It is certified that error appears in the above-identified patent and that said Letters Patent is hereby corrected as shown below:

Claim 4, col. 11, line 6, replace "1" with --2--.

Claim 7, col. 11, line 20, replace "to the" with --to a--.

Claim 11, col. 11, line 50, replace "to the" with --to a--.

Claim 20, col. 14, line 7, replace "18" with --19--.

Signed and Sealed this

Nineteenth Day of September, 2006

JON W. DUDAS
*Director of the United States Patent and Trademark Office*